March 8, 1966 T. L. DENNIS, JR 3,239,772

HIGHLY EFFICIENT SEMICONDUCTOR SWITCHING AMPLIFIER

Filed Feb. 6, 1963 2 Sheets-Sheet 1

WITNESSES

Leon J. Taga

William L. Gates

INVENTOR

Tom L. Dennis, Jr.

BY Ernest P. Klipfel

ATTORNEY

United States Patent Office 3,239,772

Patented Mar. 8, 1966

3,239,772
HIGHLY EFFICIENT SEMICONDUCTOR SWITCHING AMPLIFIER

Tom L. Dennis, Jr., Cedar Rapids, Iowa, assignor to Westinghouse Electric Corporation, Pittsburgh, Pa., a corporation of Pennsylvania Filed Feb. 6, 1963, Ser. No. 256,701
5 Claims. (Cl. 330—18)

Figure 1:
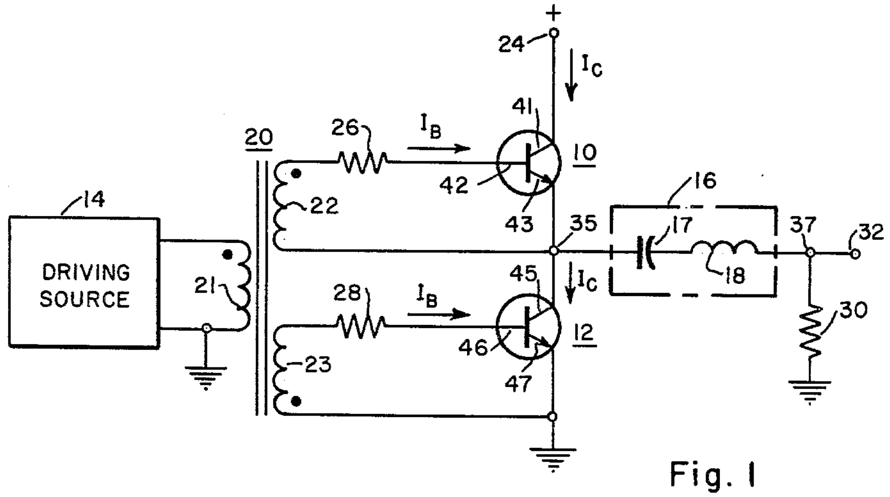

This invention relates to semiconductor amplifier circuitry and more particularly to a solid state radio frequency (RF) amplifier which utilizes transistors operated in a switching mode of operation in combination with a network having a low impedance to fundamental frequencies and a high impedance to harmonics to provide an overall operating efficiency greater than 90%.

There has long existed a need for an RF amplifier having a high efficiency particularly at high power levels such as would be encountered in radio frequency power amplifiers associated with radio transmitters. Moreover, there has been a need for a high efficiency RF amplifier which utilizes solid state devices such as transistors.

It is well known to those skilled in the art that radio frequency amplifiers, as used in transmitters, invariably fall into the "power" classification and employ vacuum tubes. They operate into tuned tank circuits which smooth out irregularities in the current wave form to give a comparatively pure sine wave input. In addition, more efficient conditions of operation are employed than for conventional audio amplifier operation. Class B and class C amplifiers fall into this grouping; however, they utilize parallel resonant tank circuits to obtain the high plate circuit impedance necessary for proper operation.

A class B RF amplifier is used where the power level of a signal is to be increased but with a linear relationship between the input and output voltages. A class C RF amplifier is more efficient than a class B amplifier but a linear relationship between the input and output voltage does not exist. The maximum theoretical plate effiiciency for the linear or class B RF amplifier is the same as for a class B audio amplifier that is 78.5%. Usual peak operating efficiencies are between 60 and 70%. Although plate circuit power efficiencies as high as 85% are possible in class C RF amplifier, most class C amplifiers are designed to operate at efficiencies of the order of 75% since there must be a very significant increase in the grid driving power to increase the plate efficiency from 75 to 85%. In summation therefore where electron tubes are utilized to provide RF amplification, the tube for most efficient operation is operating class C into a parallel resonant tank circuit.

There have been attempts to employ semiconductor devices such as transistors to provide more efficient RF amplifiers; however, these attempts have been relatively unsuccessful due to the fact that the techniques known in the electron tube art were simply extended to include semiconductors. As such parallel resonant tank circuits have been used. It should be pointed out, however, that the use of the parallel tank circuit, while providing a high impedance across the circuit, provides a low impedance current path for harmonic currents of the resonant frequency of the tank circuit. These currents flow in the circuit causing a corresponding power loss which reduces the overall efficiency of operation.

Accordingly, a primary object of the present invention is to provide a new and improved RF amplifier.

Another object is to provide an RF amplifier utilizing solid state devices, such as transistors.

It is still a further object of the present invention to provide an RF amplifier utilizing transistors and which has an overall operating efficiency greater than 90%.

Briefly, the present invention accomplishes the above-cited objects by providing an RF amplifier comprising at least one pair of transistors operating in a switching mode of operation. The transistors are coupled to a network, which provides a low impedance to the frequency to be amplified but a high impedance to all harmonics and an amplified output signal is provided in accordance with a current which flows in the network as the transistors are switched from one operating state to another. The transistors are driven such that they have mutually opposite operating states and are switched alternately between nonconducting and saturated states from a driving source providing an input signal which drives the respective transistors with just enough base current during conduction to reach saturation over its entire conduction period without overdriving it at any point. This has the effect of maintaining the saturation resistance at a minimum possible value at all times when conducting. The input signal, moreover, is periodic and has a gradually increasing and decreasing waveform for reasons which will hereinafter become evident.

Further objects and advantages of the invention will become apparent as the following description proceeds.

Figure 3:
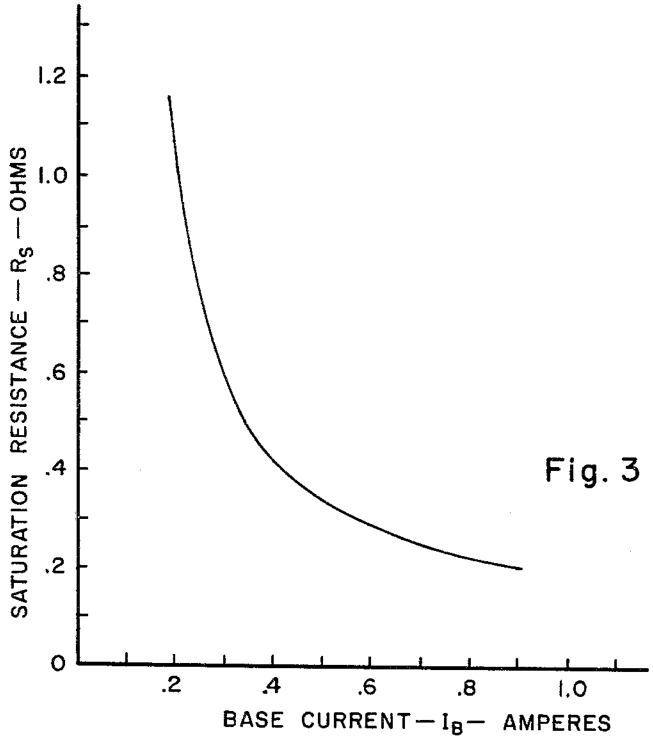
Figure 2:
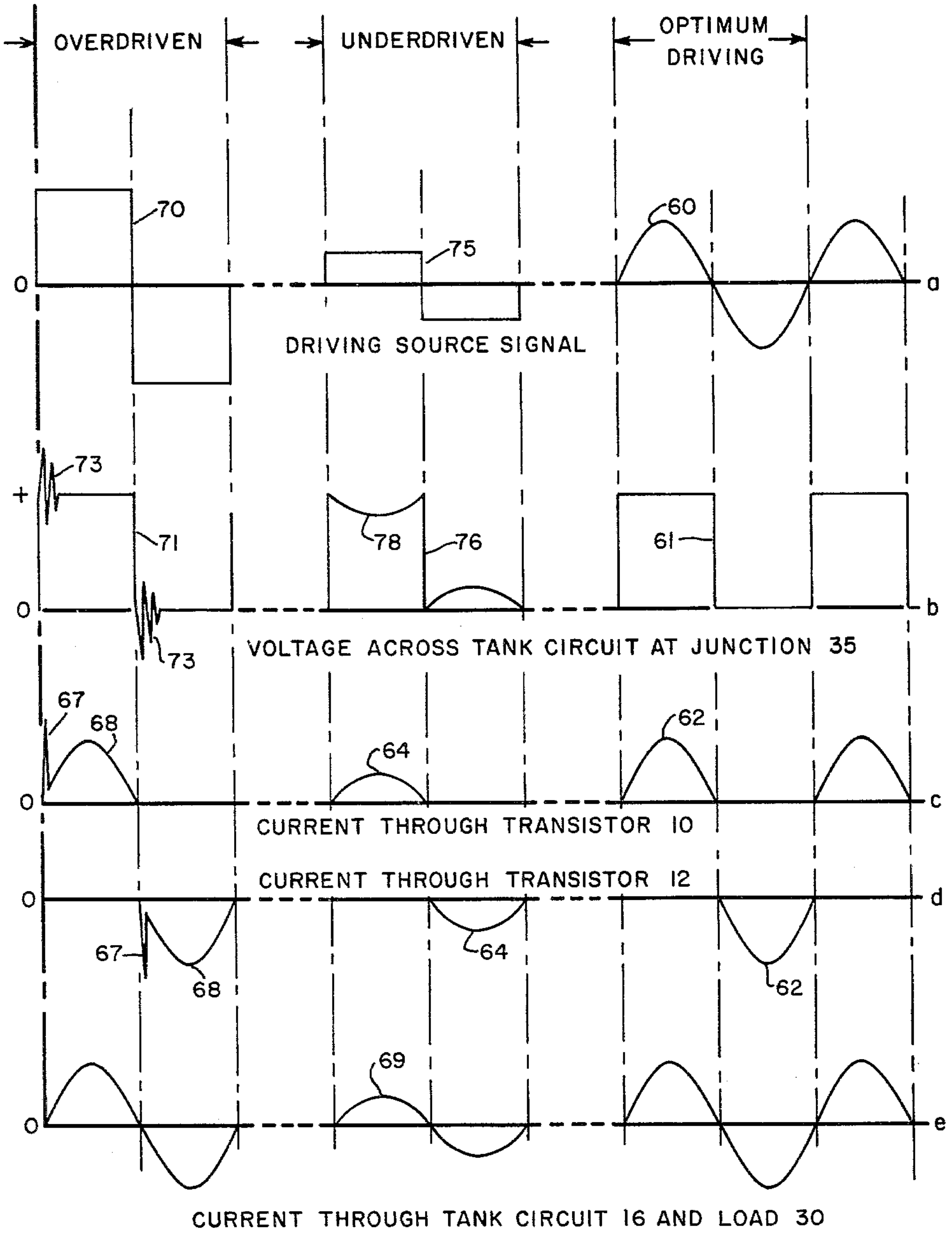

For a better understanding of the invention, reference may be had to the accompanying drawings, in which:

FIGURE 1 shows a schematic diagram illustrative of an embodiment of the present invention;

FIG. 2 including curves *a, b, c, d* and *e* are diagrams illustrating the waveforms exhibited by the embodiment of FIG. 1;

FIG. 3 is a graphic illustration of transistor saturation resistance variation with base current drive.

Referring to FIG. 1, there is illustrated a pair of N-P-N transistors 10 and 12 connected in series between terminal 24 and a point of common reference potential shown as ground. Terminal 24 is adapted to be connected to a suitable source of positive supply voltage not shown whose negative terminal is connected to ground. The transistors 10 and 12 are adapted to be driven by means of input signals applied to bases 42 and 46, respectively. These input signals are supplied from a driving source 14 and are coupled to the bases 42 and 46 by means of the transformer 20. More particularly, the primary winding 21 is connected to the driving source 14 and the secondary windings 22 and 23 are connected to the bases 42 and 46 by means of base resistors 26 and 28, respectively.

The windings 21, 22 and 23 are wound in a predetermined manner so that the voltages appearing across these windings will have predetermined relative polarities. The terminals of like instantaneous polarity are indicated by the dots located at one end of the respective windings. As such, the secondary windings 22 and 23 provide mutually opposite polarity signals to the bases 42 and 46. The secondary winding 22 is connected to transistor 10 such that the terminal indicated by the dot is connected to the base electrode 42 through base resistor 26. The opposite terminal of secondary winding 22 is connected to the emitter electrode 43 at junction 35. The secondary winding 23 is connected to transistor 12 such that the terminal having the dot is returned to ground while the opposite terminal is connected to the base 46 through base resistor 28.

As previously indicated, transistors 10 and 12 are connected in series. The common connection between transistors 10 and 12 is between the emitter 43 of transistor 10 and the collector 45 of transistor 12 at junction 35. The emitter 47 of transistor 12 is returned to ground while the collector of transistor 10 is connected to terminal 24 where a positive supply voltage, not shown, is applied.

Connected to the common junction 35 between transistors 10 and 12 is a network 16 which provides a low impedance to current flow for a predetermined fundamental frequency but a high impedance to all harmonics. One example of such a network 16 is a series resonant circuit illustrated in FIG. 1 as comprising a capacitance 17 and an inductor 18. Other equivalent networks will be readily apparent to those skilled in the art. Although shown as fixed value components, the capacitance 17 or the inductor 18 or both may be variable if desired to provide a selective tuning thereof. The opposite end of the network 16 is connected in series with a suitable load impedance 30. One end of the load 30 is returned to the reference or ground potential while the other end is connected to an output terminal 32. The load impedance 30 for example might represent the radiation resistance of an antenna. In such a case terminal 32 would tie into the antenna through a suitable impedance matching transformer or network, not shown. In any case the load would be reflected back as an equivalent impedance which is represented as a load impedance 30 shown in FIG. 1.

In operation, the transistors 10 and 12 operate as switches to alternately charge and discharge the series resonant network 16 at a frequency equal to its resonant frequency as determined by the selected values of the capacitance 17 and the inductor 18. In one half cycle of operation transistor 10 acts as a closed switch to charge the tank circuit 16 by applying the positive supply voltage source, not shown, connected to terminal 24 to one end of the tank circuit while the other end is returned to ground through the load impedance 30 thus completing a current path suitable for charging. During the aforementioned half cycle transistor 12 acts as an open switch thereby remaining inoperative.

In the other half cycle of operation transistor 12 acts as a closed switch while transistor 10 is open. The action of transistor 12 provides a discharge path for the network 16 through the transistor to ground and back through the load 30. The charging and discharging the series resonant circuit in the manner described establishes a sine wave of current in the network 16, the load 30, and the respective transistor which is conducting. The sine wave of current, moreover, will have a frequency which is equal to the resonant frequency of the network 16. The circuit operates such that during the first half cycle when the network 16 changes the current flows in one direction through transistor 10 as a half sine wave of collector-to-emitter current 10. During the other half cycle of operation the current flow reverses in the network 16 and a half sine wave of collector current flows through transistor 12. This action will be subsequently explained more fully.

It should be pointed out that the network 16 restricts the collector current flowing through the transistors 10 and 12 during respective half cycles of operation to a half sine wave due to the inherent characteristic of a resonant circuit. Since the network 16 is illustrated by way of example as a series resonant circuit, it characteristically provides a low impedance to current flow at the fundamental or resonant frequency. However, for all harmonics or multiples of the fundamental a relatively large impedance is provided restricting substantially all current flow. This being the case all harmonic currents tending to flow during respective charge and discharge periods will see a high reactive impedance and therefore will be suppressed. Since these currents do not flow they will not cause a corresponding power loss within the circuit. Therefore, the overall operating efficiency of the circuit increases to a level heretofore unobtainable in prior art apparatus. This is due to the fact that substantially all prior art apparatus utilizes parallel resonant circuits allowing harmonic currents to flow through the devices. Power is necessarily lost due to the flow of these harmonic currents.

It is evident that since harmonic currents are prevented from flowing in the applicant's invention there is no loss within the transistors except the small internal power loss due to the current flowing at the fundamental or resonant frequency of the series resonant network 16. If the transistors 10 and 12 were perfect devices, they would act as perfect switches when saturated and the internal impedance or saturation resistance of the devices at that time would be zero. Consequently, there would be no internal power loss associated with the transistors and the apparatus would have an efficiency in the vicinity of 100% except for the small power losses due to the almost negligible distributed resistance in the capacitor 17 and the inductance 18. As a practical matter this is not attainable, however it is possible to drive the transistors 10 and 12 so that the least possible internal resistance is attained over respective conduction periods. Accordingly, it is a second feature of the present invention to provide means for accomplishing this last mentioned result.

It is well known to those skilled in the art that transistors when operated in a switching mode are normally driven into saturation for most efficient operation. Saturation may be defined as that point where a further increase in input signal does not substantially provide any increase in the output signal. For a common emitter configuration, saturation occurs when an increase in base current does not cause an appreciable increase in collector current. Although little change of output occurs in the saturated region the transistors can be driven into various degrees of saturation depending on how far into saturation region the transistor is made to operate. Deep saturation is generally avoided because of its effect on the transient response of the transistor. By this is meant that when the input current $I_B$ is cut off, the output $I_C$ does not immediately fall to zero, but remains almost at its maximum value for a length of time before falling to zero. This period is called the storage time, or saturation delay time. Storage time results from injected minority carriers being in the base region of the transistor at the moment when the input current is cut off. These carriers require a definite length of time to be collected and therefore the length of storage time and cut off time is essentially governed by the degree of saturation into which the transistor is driven.

The point at which saturation is reached varies in accordance with the operating parameters imposed on the transistor, and its associated internal resistive impedance or saturation resistance is not constant for all points of saturation, but decreases where saturation is reached when operated with relatively large values of base current and collector current. FIG. 3 is an illustrative diagram of the variation of the saturation resistance with respect to base current of a typical transistor. It is seen that the saturation resistance decreases for increased base current. This is true not only for the particular transistor illustrated but for all transistors. This diagram results from measuring the slope in the saturation region of the characteristic curves showing the relationship of collector current with respect to the collector voltage for constant values of base current for a common emitter configuration.

In normal switching modes of operation the collector current follows the base current input and the transistors are generally driven by means of a square wave input or trigger pulse into the saturation region as quickly as possible to reach a point of maximum collector current and lowest possible value of saturation resistance.

It has been discovered, however, that optimum efficiency is not achieved by driving the transistors 10 and 12 by means of a square wave due to the fact that the transistors as utilized in the present invention do not behave as transistors in an ordinary switching operation. The reason for this is the network 16. As previously indicated since the network 16 is at a resonant condition a sine wave of current at the resonant frequency will flow provided a current path is provided. Since transistor 10 conducts during one half cycle while transistor 12 conducts on the other half cycle, a half sine wave of collector current flows through transistors 10 and 12 during respective half cycles. It is at this point that the operation of the transistors 10 and 12 differ from conventionally operated switching transistors. In the instant invention, although transistors 10 and 12 must be rendered "ON" (conducting) and "OFF" (non-conducting) by means of an input signal applied to respective bases, the collector current during the conducting period is restricted by the series resonant network 16. Therefore, if a relatively large instantaneous base current is provided to the respective base when the value of the collector current can only be a low value, such as when the tank is completely charged or discharged, power losses would occur due to the fact that the transistor is overdriven into deep saturation at that point. It has been discovered that the optimum efficiency of operation of the transistors occurs in the present invention when an input signal is applied to the base which has a gradually increasing wavefront and decreasing trailing edge in comparison relative to a square wave which provides a step function. Further the amplitude is of a predetermined magnitude such that only enough base current is provided at any instant of time during conduction to minimally saturate the transistor for the corresponding amount of collector current that could flow in the transistor due to the restrictive effect placed on collector current by the tank circuit 16. By driving the base in this manner, the transistors 10 and 12 when conducting provide the minimum possible reactive impedance to current flow in the charge and discharge circuits. In other words, over the conduction period each transistor appears as a resistance having a value substantially equal to the minimum possible saturation resistance, the value of which is determined by the magnitude of the sine wave of collector current at any instant. One convenient driving source meeting the requirements hereinbefore stated is a sine wave source. By driving the transistors 10 and 12 with a sine wave optimum operation is achieved providing an overall efficiency of operation in the order of 95%. Although a sine wave is mentioned by way of example, it is not meant to be a limitation since any waveform approximating a sine wave may be used.

Considering the operation of the transistors 10 and 12 as semiconductor switches in greater detail, as transistors 10 and 12 are alternately switched between the "ON" and the "OFF" state such that transistor 10 is saturated while transistor 12 is non-conducting and vice versa, the voltage at junction 35 will tend to rise to the supply voltage applied to terminal 24 when transistor 10 is "ON" and will tend to fall to ground potential when transistor 12 is "ON." Therefore, the voltage wave form at junction 35 approaches a step function as the transistor switches 10 and 12 are turned "ON" and "OFF," respectively. The maximum efficiency of the overall circuit will occur where the voltage waveform at junction 35 most nearly approaches a step function or square wave varying between the positive supply voltage and ground. It is under these conditions that the resistance to current flow presented by the transistors is at a minimum value at all times. Any deviations from the square wave indicates a reduction in efficiency away from the optimum condition.

Reference to curves *a* to *e* of FIGURE 2 illustrates the manner in which different driving source signals applied to the transistors 10 and 12 affect the overall efficiency of the circuit shown in FIG. 1. Curve *a* represents various types of driving source signals that can be applied to the respective bases of transistors 10 and 12 from source 14. Curve *b* is illustrative of the voltage waveform that appears at junction 35 for the various driving signals having the characteristics shown in curve *a*. Curves *c* and *d* illustrate the collector current flowing through transistors 10 and 12, respectively, for the driving signals of curve *a*. Curve *e* is illustrative of the current flowing in the network 16 and in the load 30 and represents the output signal.

As previously mentioned, the transistors 10 and 12 operate in push-pull fashion to alternately charge and discharge the network 16. The driving source moreover, has a frequency of operation substantially equal to the resonant frequency network as determined by values of the capacitance 17 and the inductance 18. In this manner the transistors 10 and 12 are made to switch at the resonant frequency of the network 16.

By reference to FIG. 2 curves *c*, *d* and *e*, the collector current in transistor 10, when turned "ON" by means of the sine wave signal from the driving source 14, flows as the positive half sine wave 62 of curve *c* whereas during the period when transistor 12 conducts network 16 discharges and the current flows in the opposite direction and appears as the negative half-cycle of the sine wave 63 of curve *d*. By the combined action of the switching transistors 10 and 12 the output signal appearing across the load 30 will appear as a full sine wave at the frequency of the driving source as indicated by curve *e*.

Consider the operation of the embodiment shown in FIG. 1 when a driving signal is utilized having a waveform substantially different from a sine wave such as a square wave. It can be seen by observing the respective wave forms of FIG. 2 curves *a* and *b* that a square wave of voltage is not produced at junction 35 when either a large square wave 70 or a small square wave 75 is used to drive the transistors 10 and 12 but voltage waveforms 71 and 76 respectively are produced instead. Wave form 70 is illustrative of a driving source signal in the form of a square wave which would be sufficient to turn "ON" and saturate the transistors 10 and 12 over all of their respective conduction periods and provide maximum power output; however, the action of the series resonant circuit 16 restricts the collector current such that only a small value of collector current can flow at the beginning and end of the respective conduction period in each half cycle of operation. This being the case the transistors 10 and 12 are overdriven into deep saturation at the crossover points by waveform 70 causing a storage time delay in switching. This allows both transistors to be "ON" at the same time putting a momentary short across the supply voltage causing a high transient current spike 67, as illustrated in curve *c* and *d*, to occur in the collector current which can be of sufficient magnitude to destroy the transistors. This detrimental effect is also present in the voltage waveform at junction 35 as evidenced by the transient voltage 73 illustrated in curve *b*. These spikes also increase power dissipation but most important, they can cause destructive breakdown of the transistors.

Decreasing the magnitude of the square wave driving signal to a level where the transient ceases as indicated by waveform 75 of curve *a* of FIG. 2, the transistors are not overdriven, however, at the point where maximum power output is required, that being at the peak of the sine wave of current, the transistors never reach saturation or to the extent desired as indicated by the voltage waveform 76 of curve *b* and the accompanying dip 78 at the maximum current value. The efficiency of the overall circuit is reduced because the magnitude of the base drive is not sufficient to reach saturation where the internal resistance (saturation resistance) of either transistor 10 or 12 is a minimum value.

Whereas the driving signal 70 is sufficient to reach saturation during the period of maximum current flow or the period of maximum power, the driving signal wave form 75 is insufficient and the magnitude of the sine wave 69 across the load 30 is reduced. By applying a substantially sine wave driving source signal of proper magnitude, a minimum possible saturation resistance is maintained over the entire period when either transistor 10 or transistor 12 conducts. Consequently, the waveform at junction 35 becomes substantially a square wave 61 indicative of maximum power and maximum efficiency. Therefore, a substantially sinusoidal waveform overcomes both of the inherent difficulties of the square wave driving source signal which is on one hand too great as indicated by the wave form 70 and too small as indicated by waveform 75. It is quite possible, however, that a wave shape in the form of a stair step could be utilized compromising between waveforms 70 and 75 to approach or even achieve optimum efficiency of operation; however, such a driving source is relatively difficult to achieve considering the ease of acquiring a sine wave driving source signal 60. For this reason a sine wave of predetermined magnitude is the most desirable method of driving transistors 10 and 12. Although the sine wave drive source signal has been illustrated it is not meant to be interpreted in a limiting sense. Any driving source waveform approximating the sine wave or capable of maintaining a minimum saturation resistance over the conduction period when a sinusoidal current is flowing therein is meant to be included.

Since the fundamental component of a square wave is 1.27 times the amplitude of the square wave, the sine wave of voltage appearing across the load 30 is larger in peak to peak amplitude than the D.C. voltage applied to the circuit, thus providing the required amplification.

As an example of the overall efficiencies obtainable, the present invention has been practiced using a pair of Pacific Semiconductor Industry 2N1900 transistors with a D.C. supply voltage of +97.3 volts and an input power of 302 watts. A power output of 275.3 watts was obtained with a measured power loss of 12.6 watts, in the tuned circuit thereby providing an overall efficiency of 91.1%. In another practical embodiment, using a pair of RCA TA2111 transistors with a D.C. supply voltage of +130 volts and an input power of 312 watts, a power output of 299 watts was obtained with a measured loss in the tuned circuit of 7.6 watts. The overall efficiency in this embodiment was 95.8%. In both cases the transistor efficiency was greater than 90%.

In summation therefore what has been described is an RF amplifier using a plurality of like conductivity transistors having mutually opposite operating states operating in a switching mode of operation and being driven from a signal source providing a signal gradually increasing and decreasing magnitude over the period of operation to maintain saturation of the transistors during conduction at a minimum level over substantially all of the respective conduction periods. The transistors moreover act to charge and discharge a resonant network at a rate which is equal to the resonant frequency of the network. By means of the resonant network and the driving source providing the required input signal an overall efficiency of operation is obtainable which is greater than 90%, far surpassing the efficiency attainable by vacuum tubes and presently known semiconductor art.

Although the present invention has been described with respect to a preferred embodiment thereof which gives satisfactory results, it should be understood that the present disclosure has been made only by way of example and that numerous changes in the detail of circuitry by way of the combination or arrangement of elements may be resorted to without departing from the scope and spirit of the present invention. For example, PNP type transistors may be employed in the subject invention when accompanied by a corresponding rearrangement of voltage polarities. This is well known to those skilled in the art. Also where a greater power handling capabability is required a parallel arrangement of a plurality of semiconductor devices may be resorted to. In addition, the resonant network illustrated as a simple series circuit may be replaced by a suitable filter, such as a low pass or band pass filter, when desired. Any network providing the disclosed frequency response is meant to be included in the teachings of this invention.

I claim as my invention:

1. In a semiconductor amplifier having an efficiency greater than 90% and operative with a voltage source and a point of reference potential, the combination comprising; at least two transistors of like conductivity having a common connection and being connected between said supply voltage and said point of reference potential; an input signal source providing a driving signal to said transistors for operating said transistors as a pair of semiconductor switches having mutually opposite operating states, said input signal having a predetermined frequency and waveshape to operate said transistors alternately between conducting and non-conducting states, said conducting state being in the saturation region of the current voltage characteristic of said transistors, said input current signal providing only enough current to maintain saturation, when conductive; a tuned network providing a low impedance to a preselected resonant frequency and a high impedance to harmonic frequencies, said preselected resonant frequency being substantially equal to said predetermined frequency of said input signal, said network being connected to said common connection between said transistors and being alternately charged and discharged therethrough so that one of said at least two transistors provides a charging path and the other of said at least two pair of transistors provides a discharging path wherein a half sine wave of current of a first polarity flows through said one transistor during charging and a half sine wave of current of a second polarity flows through said other transistor during said discharging; and output means operatively connected to said resonant circuit for detecting current flow through said tuned network during said charging and discharging to provide an output signal in accordance therewith.

2. In a solid state radio frequency amplifier having an overall efficiency greater than 90% and operative with a predetermined voltage source: a first transistor and a second transistor, each having like semiconductivity and each having a base, a collector and an emitter; circuit means connecting the emitter of said first transistor with the collector of said second transistor and means connecting the collector of said first transistor to said voltage source and the emitter of said second transistor to a point of reference potential; a network having low impedance to a predetermined resonant frequency and a high impedance to harmonic frequencies thereof; said network coupled to said emitter of said first transistor and said collector of said second transistor; load means connected between said network and a point of reference potential; input means including a driving source for said first and said second transistor having a frequency substantially equal to said predetermined frequency of said network and providing an input signal current to said base of said first and said second transistor for operating said first and said second transistor in a switching mode of operation such that mutually opposite operating states exist while each is being alternately switched between conducting and non-conducting states, said network being charged by the voltage source through said first transistor when conducting and discharged to said reference potential by means of said second transistor when conducting thereby providing a collector current in said first and said second transistor varying in accordance with a sine wave at said resonant frequency, said input current signal to said bases being of a predetermined magnitude and wave shape to saturate said first and said second transistor, when conducting alternately to a minimum degree of saturation for the magnitude of sinusoidal current flowing at any instant during conduction.

3. The apparatus substantially as claimed in claim 2 wherein said input current signal comprises substantially a sine wave of input current of predetermined magnitude.

4. A power amplifier comprising, in combination; semiconductor means utilized in a switching mode; a resonant network having a low impedance to a fundamental frequency and a high impedance to harmonic frequencies thereof connected to said semiconductor means to be charged and discharged therethrough; said resonant circuit allowing only a sine wave of current at said fundamental frequency to be switched by said semiconductor means; and means driving said semiconductor means with a sine wave input signal at said fundamental frequency and having an instantaneous magnitude only sufficient to minimally saturate the semiconductor means to allow the instantaneous magnitude of sine wave current through said semiconductor means.

5. In a power amplifier, the combination comprising; a resonant network, including a load resistor, having a low impedance to a fundamental frequency and a high impedance to harmonic frequencies thereof; means, including first transistor means, connected to said resonant network for charging said network; means, including second transistor means, connected to said resonant network for discharging said network; means for alternately rendering said first and said second transistor means conducting and non-conducting respectively in a switching mode as the resonant current in said network changes polarity; said means for rendering driving said transistor means with a waveform in phase with the waveform of the resonant current of said network; said waveform having a magnitude sufficient to reduce the saturation resistance to a minimum whereby underdriving and overdriving will be precluded when the transistor means is in its ON mode of operation.

References Cited by the Examiner

UNITED STATES PATENTS

| | | | |
|---|---|---|---|
| 2,972,710 | 2/1961 | D'Amico. | |
| 3,078,379 | 2/1963 | Plogstedt et al. | |
| 3,115,582 | 12/1963 | Yoshii et al. | 330—18 X |
| 3,165,642 | 1/1965 | Noll. | |

FOREIGN PATENTS

| | | |
|---|---|---|
| 1,111,672 | 7/1961 | Germany. |

OTHER REFERENCES

Ryder: Network, Lines and Fields, Prentice Hall, New Jersey, 1955, page 61 relied on.

ROY LAKE, *Primary Examiner.*

NATHAN KAUFMAN, *Examiner.*